US 6,670,815 B2

(12) United States Patent
Moddemann

(10) Patent No.: US 6,670,815 B2
(45) Date of Patent: Dec. 30, 2003

(54) ELECTRIC DEVICE AS WELL AS PROCESS FOR ITS OPERATION

(75) Inventor: Jörg Moddemann, Hohberg (DE)

(73) Assignee: Berger Lahr GmbH & Co. KG, Lahr (DE)

( * ) Notice: Subject to any disclaimer, the term of this patent is extended or adjusted under 35 U.S.C. 154(b) by 79 days.

(21) Appl. No.: 09/934,414

(22) Filed: Aug. 21, 2001

(65) Prior Publication Data

US 2002/0074962 A1 Jun. 20, 2002

(30) Foreign Application Priority Data

Aug. 24, 2000 (DE) .......................................... 100 41 607

(51) Int. Cl.[7] .......................... G01R 31/08; G01R 31/34; H02K 11/04
(52) U.S. Cl. .......................... 324/527; 324/772; 318/490
(58) Field of Search ................................ 324/527, 526, 324/772, 158.1, 119; 363/50, 58; 388/907, 917, 918; 318/490, 434

(56) References Cited

U.S. PATENT DOCUMENTS

| | | | | |
|---|---|---|---|---|
| 4,031,465 A | * | 6/1977 | Sterner | 324/766 |
| 4,263,557 A | * | 4/1981 | Jarvinen | 388/809 |
| 5,604,670 A | * | 2/1997 | Sonoda | 363/56.04 |
| 6,278,623 B1 | * | 8/2001 | Garces et al. | 363/46 |

FOREIGN PATENT DOCUMENTS

| | | |
|---|---|---|
| DE | 3029851 C2 | 3/1985 |
| DE | 3732718 C2 | 7/1993 |
| DE | 4441070 C2 | 12/1997 |

* cited by examiner

*Primary Examiner*—Anjan K. Deb
(74) *Attorney, Agent, or Firm*—Volpe and Koenig, P.C.

(57) ABSTRACT

In a process for operating an electric device (1), especially an electric motor drive, an electric consumer (6) is fed from an a.c. network in that the input alternating voltage that is rectified and the intermediate circuit voltage so obtained is applied to the half bridges of a bridge circuit. Each of the half bridges has two bridge arms (7a, 7b) in which in any given case at least one semiconductor switch (8a, 8b) is arranged, to which control signals are applied through an actuation circuit (9a, 9b) fed from an auxiliary supply voltage source (16). Each of the bridge arms is connected to one of the poles (4) of the intermediate circuit voltage (5), and a test shutdown of the auxiliary supply voltage is applied to the actuation circuit (9a, 9b) of this semiconductor switch (8a, 8b) during a non-actuation phase of the semiconductor switch (8a, 8b) arranged in the relevant bridge arm. This test shut down is monitored by a measurement, and when an error occurs, at least the auxiliary supply voltages applied to the actuation circuits (9a, 9b) of the bridge arms (7a, 7b) connected to the other pole of the intermediate circuit voltage are shut down.

10 Claims, 2 Drawing Sheets

ELECTRIC DEVICE AS WELL AS PROCESS FOR ITS OPERATION

BACKGROUND

Figure 1:
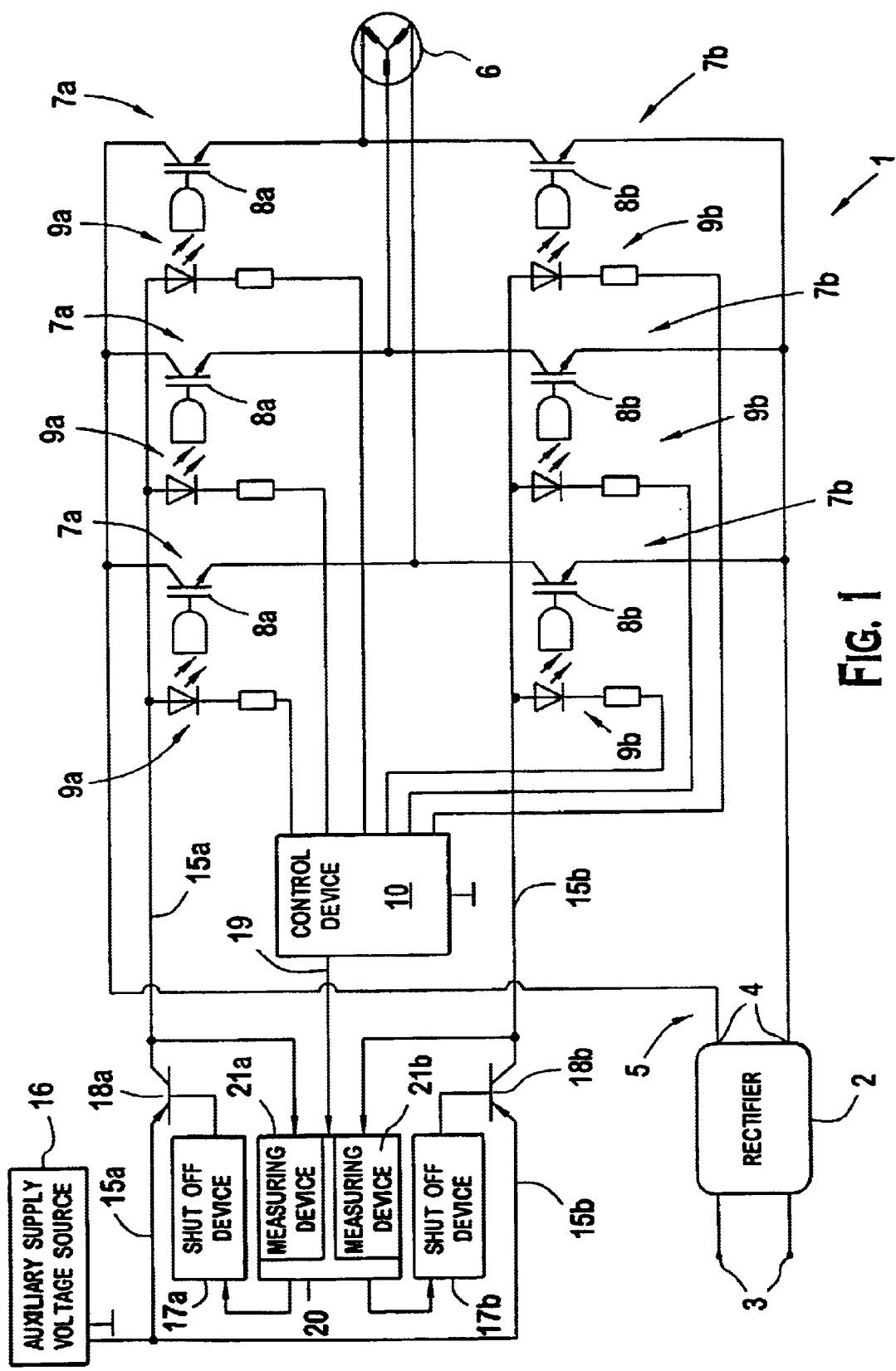

The invention related to a process for operating an electric device, especially an electric motor drive, whereby an electric consumer is fed out of an a.c. network since the input alternating voltage is rectified and the intermediate circuit voltage so obtained is applied to the half bridge of a bridge circuit, whereby each half bridge has two bridge arms in which, in any given case, a semiconductor switch is arranged to which control signals are applied through a control loop fed by an auxiliary supply voltage.

Furthermore, the invention concerns an electrical device, in particular an electric motor drive with an electric consumer connected with the a.c. network through a frequency converter, whereby the frequency converter has an intermediate circuit connected to the a.c. network through a rectifier which is connected with the electric consumer through a bridge circuit, whereby the bridge circuit has at least two half bridges with two bridge arms in each case in which, in any given case, a semiconductor switch is arranged, whereby the semiconductor switches are at all times connected to a control signal output of a control apparatus, and whereby the operating voltage terminal connections of the actuation circuits are connected with an auxiliary voltage supply source.

According to EN 954-1 "Safety of Machines-Safety-Related Part of Control Units," electric devices are classified according to various hazard classes or categories as a function of the hazard potential which arises from the operating device. The efficiency of safety measures required is also regulated in this standard. Five categories, B, 1, 2, 3, and 4 are distinguished, of which category four imposes the highest standards on protective measures. The present invention chiefly relates to category three in accordance with EN 954-1, that is to applications where severe, irreversible injuries are frequently possible, where preventing their hazards is possible under certain conditions. With this category, a single error may not lead to a failure of the safety function.

On the basis of DE 30 29 851 C2, an electrical apparatus of the type mentioned at the beginning is already known where the output connections of the rectifier connected to the a.c. network having intermediate circuit voltage are connected through safety elements with both input terminal connections or poles of the bridge circuit. The bridge circuit has three half bridges whose output terminals are connected with the windings of an electric motor. Each of the half bridges has, in any given case, two bridge arms of which one joins the first output terminal of the half bridge with the one pole of the intermediate circuit and the other joins the second output connection of the half bridge with the other pole of the intermediate circuit. In the bridge arms, a thyristor is arranged as a semiconductor switch, the control input of which is connected with a control apparatus through an actuation circuit. By means of the control device, control signals for a pulse duration modulation is applied to the control inputs of the thyristors such that the motor windings connected with the output terminals of the three half bridges generate a circulating magnetic field of rotation. Here the thyristors of the individual half bridges are in each case actuated such that at all times one of the two bridge arms is conducting while the in any given case other bridge arm is blocked.

The control apparatus is constructed redundant and has two microcomputers of which the one actuates the three thyristors connected with the one pole of the intermediate circuit voltage and the other activates the three thyristors connected with the other pole of the intermediate circuit voltage. The two microcomputers are connected with each other through a bi-directional data line and mutually monitor themselves, since in each of the microcomputers a comparison of results is conducted after mutual data exchange. According to indication of the patent specification, any failure of a thyristor already leads to a short circuit after a short time, and therewith to the response of the safety elements. In this way, the electric motor connected at the bridge circuit is shut off. Here it is unfavorable, however, that shutting off the electric motor presupposes the orderly function of the safety elements. In the event of a defect on the safety elements, a dangerous operating state of the electric motor can thus arise.

A non-representative device is already known on the basis of DE 44 41 070 C2 which is actuated through an electronic safety circuit. The safety circuit is constructed redundant and has two computer units which in each case have a control input connected with a light barrier to monitor a protective field situated in the area of an electric consumer. The computer units are in each case connected through signal lines with inputs of an actuation circuit which has two semiconductor switches by means of which a control output of the actuation circuit is alternatively connectable with an auxiliary voltage source or with ground potential. Here the electrical consumer is only switched on when the control inputs of both actuation circuits are active.

For checking the function of the semiconductor switch, the actuation circuits have feedback leads which are connected with feedback inputs of the computer units. By means of the computer units, test impulses are emitted in any given case over the signal lines to the control outputs of the actuation connections and are then feedback over the feedback inputs. If an error is detected here, at least the still functional semiconductor switches are opened by the computer units. The safety circuit nevertheless has the disadvantage that the operation of the electrical consumer can be disturbed by applying the test impulses, as the consumer is shut down for a short time during the test phase.

SUMMARY

For this reason, there exists the objective of creating a process and a device of the type mentioned at the beginning which makes possible a safe shut down of the electric consumer.

Accomplishing this objective includes a process of the type mentioned at the beginning in that, with each of the bridge arms at all times connected to one of the poles of the intermediate circuit voltage, a test shut down of the auxiliary voltage supply applied to the actuation circuit of this semiconductor switch, in that this test circuit is monitored by a measurement, and in that when an error occurs, at least the bridge arms of the auxiliary supply voltages applied to the half bridges connected at the actuation circuits of the other pole of the intermediate circuit voltage are shut down.

Through separate shut down of the auxiliary supply voltages of the actuation circuits for the "upper" and "lower" bridge arm, there results a two channel independent shut down of the electric motor drive. Since the test circuit makes possible a cyclical check of the shut down function of the electric consumer, a secure emergency out function is made possible even when using economical semiconductor components for shutting down the auxiliary supply voltage and/or for actuating the semiconductor switch of the bridge circuit.

With an especially advantageous embodiment of the invention, the test shut down is conducted during a non-actuation phase of the semiconductor switch arranged in the bridge arm to be shut down. In this way, it is possible, on the one hand to test the actuation circuit, and on the other, however, to test shutting down the auxiliary supply voltages as well without in this way impairing the operation of the electrical consumer. Checking the shut down function of the auxiliary supply voltage and the actuation circuits can consequently take place unnoticed in the background for the user of the electrical device which enables a trouble-free operation of the electric motor drive.

It is advantageous if, with bridge arms connected at the same pole of the intermediate circuit voltages, the test shut down of the auxiliary supply voltages applied to the actuation circuits of the semiconductor switches arranged in the bridge arms is conducted simultaneously. The test shut down of the auxiliary supply voltages for the actuation circuits of the bridge arms connected a the positive pole of the intermediate circuit voltage can thus be conducted by means of a single semiconductor switch element jointly for these bridge arms. At the same time, the test shut down takes place, in any given case, when all semiconductor circuits which are connected at the relevant pole of the intermediate circuit voltage are not simultaneously actuated. That means when all semiconductor switches which are connected at the other pole of the intermediate circuit voltage are actuated.

With an advantageous embodiment of the process, it is provided that, for synchronization of the test shut downs of the auxiliary supply voltages applied to the actuation circuits with the control signals applied to the semiconductor switches, the temporal course of power consumption of at least one actuation circuit is measured and compared with a threshold value. In this way, a synchronization line between the control apparatus provided to generate control signals and a shut down control device controlling the test shut down of the auxiliary supply voltages applied to the actuation circuits can be spared.

With an appropriate configuration of the invention, it is provided that the control of the test shut downs takes place by means of a microcomputer and that preferably, for each semiconductor switch or for each group of semiconductor switches, where the test shutdown is simultaneously conducted, an independent microcomputer is provided in each case, and that the microcomputers if need be mutually monitor themselves, whereby when an error occurs, at least the auxiliary supply voltages applying to the actuation circuits of the bridge arms connected at one pole of the intermediate circuit voltage are shut down. In this way, the reliability of the shut down function for the electric consumer can be additionally increased.

The accomplishment of the previously mentioned objective with regard to an electrical device of the type mentioned at the beginning provides that the operating voltage terminal connections of the actuation circuits of bridge arms connected with different poles of the intermediate circuit are connected over separate actuation devices having in each case at least one semiconductor switch element with the auxiliary supply voltage, and in that a measuring device connected with a control apparatus for monitoring of the test shutdown is connected in series after the semiconductor switch elements of the shut down devices which has outputs connected with control inputs of the semiconductor switch elements of the shut down devices, and is constructed such that it shuts down all bridge arms connected with the other pole of the intermediate circuit when an error occurs when shutting down a bridge arm connected with one pole of the intermediate circuit.

Advantageously, the combination on the basis of the measuring device and the shut down apparatus makes possible a monitored test shut down of auxiliary supply voltage applying in each case on the actuation circuit of individual semiconductor switches. Since the trouble-free function of the test shutdown conducts checks by means of the measuring apparatus, and when an error arises, the electric consumer is shut down, a high shut down safety can be attained despite the semiconductor circuit element provided for shutting off the auxiliary supply voltage.

With an especially advantageous embodiment of the invention, it is provided that shut down devices for the test shut off of the actuation circuits connected with them during a non-actuating phase of the semiconductor switch actuatable with these actuation circuits are connected with a synchronization facility. In this way, it is possible to test the shut down of the auxiliary supply voltage without impairing the operation of the electric consumer.

It is advantageous if the operating voltage terminals of the actuation circuits of the bridge arms connected at the positive pole of the intermediate circuit and the operating voltage connections of the actuation circuits of the bridge arms connected at the negative pole of the intermediate circuit are connected in any given case with a common shut off facility. In this way, there results a simply constructed shut down device. The shut down of the auxiliary supply voltage takes place by means of the shut off apparatus at all times when all semiconductor switches of the bridge arms allocated in any given case to the shut down device are not simultaneously actuated and are consequently inactive.

It is provided with an advantageous embodiment that the synchronization device for detection of non-actuation phases of the semiconductor switch to be shut off with the respective shut off device has a current measuring device constructed for measuring the operating current of at least one actuation circuit, and that the measuring output of this current measuring unit is connected with a comparison device for comparing the current measuring signal with a threshold value. Since the operating current of the actuation circuit is dependent upon the control state of the actuation circuit or of the semiconductor switch connected in series, there results with a switched through semiconductor switch another operating current that with a blocked semiconductor switch. The non-actuation phase of the semiconductor switch can for this reason be ascertained by means of the current measuring apparatus during the non-actuation phase of the semiconductor switch without a synchronization line between the control unit generating the control signal for the semiconductor and the shut off device and/or the monitoring apparatus being necessary.

It is advantageous if the shut down facilities for the actuation circuits of the semiconductor switches arranged in the bridge arms connected with the various poles have their own microcomputer in any given case, and if these microcomputers are connected with one another for mutual data exchange through a data connection. The microcomputers can then mutually monitor conducting the test, for example in the manner of a watchdog function, whereby when an error occurs, the auxiliary supply voltage is shut off by means of the shut down facility in whose microcomputer the error was recognized.

BRIEF DESCRIPTION OF THE DRAWING(S)

Figure 2:
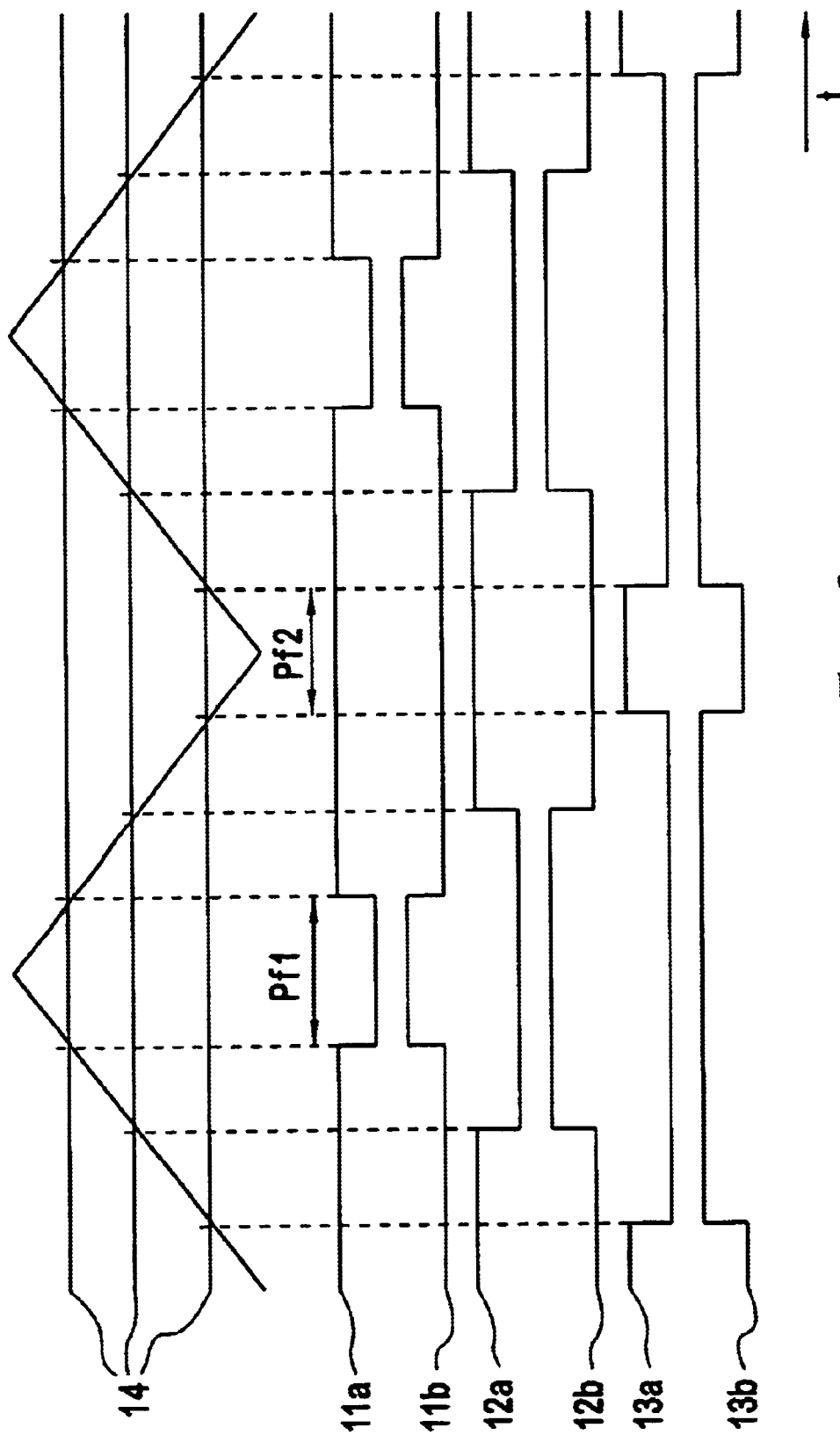

A preferred embodiment of the invention is explained in greater detail below on the basis of the drawing, wherein:

FIG. 1 shows a partial circuit diagram of an electrical device which has an electric motor actuated through a bridge circuit having a semiconductor switch, and FIG. 2 provides a graphic representation of a triangular signal and the control signals derived from it for actuating the semiconductor switch of the bridge circuit illustrated in FIG. 1, whereby the time is plotted in the direction of the arrow designated with "t" and at right angles to this in each case the signal level.

DETAILED DESCRIPTION OF THE PREFERRED EMBODIMENT

An electrical device designated overall with 1 has a rectifier 2 whose input terminal connections 3 are connected with the a.c. network and whose output terminals are in each case connected with one pole 4 of an intermediate circuit 5. By means of the rectifier 2, the input alternating voltage or the line voltage is rectified into an intermediate circuit voltage which applies to the poles 4 of the intermediate circuit 5. The intermediate circuit 5 is connected with an electric consumer 6, namely an electric motor, over a bridge circuit.

The bridge circuit has three half bridges which in each case have a first bridge arm 7a, arranged above in FIG. 2, and a second bridge arm 7b arranged below in FIG. 2. The two bridge arms 7a, 7b of each half bridge are in any given case connected with each other with one of their connections, and with their other terminal, to different poles 4 of the intermediate circuit 5. The connection points of the bridge middle points forming bridge arms 7a and 7b are in each case connected through supply leads with a terminal connection of the star-connected winding strands of electric motor 6.

In each of the bridge arms 7a, 7b, a semiconductor switch 8a, 8b constructed as a transistor is arranged whose collector-emitter section is switched into the semiconductor bridge. The control inputs or base terminals of the semiconductor switches 8a, 8b are in any given case connected through an actuation circuit 9a, 9b at a control signal output. By means of control device 10, pulse duration modulated control signals 11a, 11b, 12a, 12b, 13a, 13b are generated for semiconductor switches 8a, 8b which apply to the control signal outputs of the control device 10.

In FIG. 2, the signal courses of control signals 11a, 11b, 12a, 12b, 13a, 13b basically constructed as rectangular signals are graphically represented. Here the control signal of the first bridge arm 7a of the first half bridge is designated with 11a and that of the second bridge arm 7b of the first half bridge is designated with 11b. Correspondingly, in FIG. 2, the control signals of the second half bridge are designated with 12a, 12b and those of the third half bridge with 13a, 13b. It is unambiguously recognizable that the control signal of the first bridge arm 7a and the second bridge arm 7b of a half bridge are in each case inverted in relation to each other. That means when the semiconductor switch 8a of the first bridge arm 7a of a half bridge is actuated or active, the semiconductor switch 8b of the second bridge arm 7b of the same half bridge is in any given case not actuated or else inactive.

The points in time at which control signals 11a, 11b, 12a, 12b, 13a, 13b change their signal gauge are marked in each case with dotted lines in FIG. 2. The corresponding points in time are ascertained in control unit 10 by comparison of the triangular signal represented in FIG. 2 top with threshold values 14 which cut the signal course of the triangular signal.

Actuation circuits 9a, 9b have in each case an optical coupler one terminal of which is connected through a supply line 15a, 15b with auxiliary supply voltage source 16 and whose other terminal is connected with the control signal output of the control unit 10 allocated to it in any given case. It is recognizable in FIG. 1 that the actuation circuits 9a, 9b of semiconductor switches 8a, 8b which are connected at the same pole 4 of the intermediate circuit with the auxiliary supply voltage source 16, are in any given case connected through a common supply line 15a, 15b.

The auxiliary supply voltage applied to actuation circuits 9a of the first bridge arm 7a can be shut off by means of a first shut down device 17a and the auxiliary supply voltage applied to the shut off circuits 9b of the second bridge arm 7b can be shut off by means of a second shut down device 17b. Shutdown devices 17a, 17b have in any given case a semiconductor switch element 18a, 18b wired to the supply line 15a, 15b. In the example according to FIG. 1, the semiconductor circuit elements 18a, 18b are transistors.

By means of shut off device 17a, during a non-actuation phase, in which none of the semiconductor switches 8a arranged in the first bridge arms 7a are actuated by one of control signals 11a, 12a, 13a, a test shut down of the auxiliary supply voltage applied to shutdown circuit 9a is conducted. In FIG. 2, a non-actuation phase of semiconductor switch 8a is marked by double arrow Pf1. Synchronization of the test shut down with the non-actuation phases takes place through a synchronization line 19 which connects the control device 10 with a control device 20 triggering the test shut down.

During the test shut down, electric voltage is measured on the terminal of the actuation circuit 9a connected with supply line 15a by means of a measuring device 21a connected with supply line 15a. The measurement values ascertained in this way for electric voltage are forwarded to the control device 20 connected with the measuring unit 21a and there compared with a specified threshold value. In the event that this threshold value, for example, should be exceeded owing to a defect in the semiconductor circuit element, an error is recognized and the auxiliary supply voltage applying to the first actuation circuit 9b is shut down by means of the second shut off device 17b. The shut off device 17b is connected with the control device 20 over a control line 22a for this. The actuation circuits 9a, 9b become inactive by shutting down the auxiliary supply voltage so that the two semiconductor switches 8b block. In this way, the flow of current in drive motor 6 is interrupted with great certainty even when one or more of the first semiconductor switches 8a should be conducting. But even then when in addition one or several of the semiconductor switches 8b should have a defect, the formation of a rotating field in the drive motor is prevented.

Correspondingly, by means of shut off device 17a, during a non-actuation phase, in which none of the semiconductor switches 8b arranged in the two bridge arms 7b is actuated by one of control signals 11b, 12b, 13b, a test shut off of the auxiliary provision voltage applying in the actuation circuit 9b is conducted. In FIG. 2, a non-actuation phase of the semiconductor switch 8b is market by double arrow Pf2. During the test shut down, electrical voltage is measured at the terminal of the actuation shut off 9b connected with the supply line 15b by means of a measuring device 21b. The measured values for the electrical tension are forwarded to control device 20 connected with the measuring device 21b and there compared with a specified threshold value. In the event that this threshold value is exceeded, the error is recognized and the auxiliary supply voltage applied to the first actuation circuit 9a is shut off over control line 22b and first shut off unit 17a.

The test shut off of the auxiliary supply voltages applied to the actuation circuits 9a, 9b is repeated cyclically, for example every eight ours, as is described in position paper DKE-AK 226.03.

In the process for operating the electric device 1, an electric consumer 6 is thus fed from an a.c. network, in that the input alternating voltage is rectified and the intermediate circuit voltage so obtained is applied to the half bridges of a bridge circuit. Each of the half bridges has two bridge arms 7a, 7b in which, in any given case, at least one semiconductor switch 8a, 8b is arranged, to which, through an actuation circuit 9a, 9b fed from an auxiliary supply voltage source, control signals are applied. With each of the bridge arms connected at any given time to one of the poles 4 of intermediate circuit voltage 5, a test shut off of the auxiliary supply voltage applying to the actuation circuit 9a, 9b of this semiconductor switch 8a, 8b is conducted during a non-actuation phase of the semiconductor switch 8a, 8b arranged in the relevant bridge arm. This test shut off is monitored by a measurement and when an error occurs, at least the auxiliary supply voltages connected to the actuation circuits 9a, 9b on the other pole of the intermediate circuit voltage are shut off.

What is claimed is:

1. Process for operating an electric motor drive, comprising feeding an electric consumer (6) from an a.c. network, rectifying an input alternating voltage and applying an intermediate circuit voltage so obtained to half bridges of a bridge circuit, whereby each of the half bridges has two bridge arms (7a, 7b) in which at least one semiconductor switch (8a, 8b) is arranged, to which control signals are applied through an actuation circuit (9a, 9b) fed from an auxiliary supply voltage, wherein in each of the bridge arms (7a, 7b) connected at any given time to one of the poles (4) of an intermediate circuit voltage, conducting a test shut off of the auxiliary supply voltage applied to one of the actuation circuits (9a, 9b) of the semiconductor circuit (8a, 8b), monitoring the test shut off by a measurement, and when an error occurs, shutting off at least the auxiliary supply voltages applied to the actuation circuits (9a, 9b) of the bridge arms (7a, 7b) of the half bridges connected to the other pole of the intermediate circuit voltage.

2. Process according to claim 1, wherein the test shut off is conducted during a non-actuation phase of the semiconductor switch (8a, 8b) arranged in the bridge arm (7a, 7b) to be shut down.

3. Process according to claim 1, wherein when the bridge arms (7a, 7b) are connected to the same pole (4) of the intermediate circuit voltage, the test shut off of the auxiliary supply voltages applied to the actuation circuits (9a, 9b) of the semiconductor switches (8a, 8b) arranged in the bridge arms is conducted simultaneously.

4. Process according to claim 1, wherein, for synchronization of the test shut offs of the auxiliary supply voltages applied to the actuation circuits (9a, 9b) with the control signals (11a, 11b, 12a, 12b, 13a, 13b) applied to the semiconductor switches (8a, 8b), the course over time of power consumption of at least one of the actuation circuits (9a, 9b) is measured and compared with a threshold value.

5. Process according to claim 1, wherein the control of the test shut offs takes place via a microcomputer, and wherein for each of the semiconductor switches (8a, 8b) or for each group of semiconductor switches (8a, 8b) in connection with which the test shut down is conducted simultaneously, a microcomputer is at all times provided, and wherein the microcomputers monitor one another, whereby when an error occurs, at least the auxiliary supply voltages applied to the actuation circuits of the bridge arms (7a, 7b) connected to one of the poles of the intermediate circuit voltage are shut off.

6. Electric motor drive, comprising an electrical consumer (6) connected through a frequency converter with an a.c. network, whereby the frequency converter has an intermediate circuit (5) connected through a rectifier (2) to the a.c. network, comprising a bridge circuit having at least two half bridges with two bridge arms (7a, 7b), semiconductor switches (8a, 8b) connected at all times to a control signal output of a control device (10), and operating voltage terminals of actuation circuits (9a, 9b) are separately connected with an auxiliary supply voltage source (16), wherein the operating voltage terminals of the actuation circuits (9a, 9b) of bridge arms (7a, 7b) of the bridge circuit connected with different poles (4) of the intermediate circuit (5) are connected through separate shut off devices (17a, 17b) having at least one semiconductor switch element (18a, 18b) with an auxiliary supply voltage source (16), and wherein a measuring apparatus (21a, 21b) connected with a control device for monitoring the test shut off is connected in series following the semiconductor switch elements (18a, 18b) of the shut off devices (17a, 17b) which has outputs connected with control inputs of the semiconductor switch elements (18a, 18b) of the shut off devices (17a, 17b), and is constructed such that it shuts off all of the bridge arms (7a, 7b) connected with the other pole (4) of the intermediate circuit (5) when an error occurs in shutting down the bridge arm (7a, 7b) connected with one pole (4) of the intermediate circuit (5).

7. Electrical device according to claim 6, wherein the shut off devices (17a, 17b) are connected with a synchronization device for a test shut down of the actuation circuits (9a, 9b) during a non-actuation phase of the semiconductor switches (8a, 8b) actuatable with the actuation circuits (9a, 9b).

8. Device according to claim 7, wherein the synchronization device for detecting the non-actuation phases of the semiconductor switches (8a, 8b) to be shut off with the respective shut off device (17a, 17b) has a current measuring apparatus constructed for measurement of an operating current of at least one actuation circuit (9a, 9a), and wherein the measurement output of the current measuring apparatus is connected with a comparison device for comparing the current measuring signal with a threshold value.

9. Electric device according to claim 6, wherein the operating voltage terminals of the actuation circuits (9a, 9b) of the bridge arms (7a, 7b) connected at the positive pole of the intermediate circuit (5) and the operating voltage terminals of the actuation circuits of the bridge arms (7a, 7b) connected at the negative pole of the intermediate circuit (5) are connected with a joint shut off device (17a, 17b).

10. Device according to claim 6, wherein the shut down devices (17a, 17b) each have a microcomputer and wherein the microcomputers are connected with each other through a data connection for mutual data exchange.

* * * * *